United States Patent [19]
Olde Heuvel

[11] Patent Number: 5,227,716
[45] Date of Patent: Jul. 13, 1993

[54] MEASURING INSTRUMENT WITH DIGITAL PARAMETER CONTROL

[75] Inventor: Johannes B. Olde Heuvel, Almelo, Netherlands

[73] Assignee: U.S. Philips Corporation, New York, N.Y.

[21] Appl. No.: 834,027

[22] Filed: Feb. 11, 1992

[30] Foreign Application Priority Data

Mar. 7, 1991 [NL] Netherlands .................. 9100409

[51] Int. Cl.$^5$ .................. G01R 13/00; G01R 15/08
[52] U.S. Cl. .................. 324/115; 324/121 R; 364/487
[58] Field of Search .................. 324/115, 121 R, 103 R, 324/116, 166; 340/722, 706, 709; 364/487, 483; 315/364, 367

[56] References Cited

U.S. PATENT DOCUMENTS

| | | | |
|---|---|---|---|
| 4,629,981 | 12/1986 | Barbiaux | 324/166 |
| 4,743,844 | 5/1988 | Suzuki et al. | 324/121 R |
| 4,859,935 | 8/1989 | Smith et al. | 325/121 R |
| 4,975,689 | 12/1990 | Suzuki et al. | 324/121 R |
| 5,019,773 | 5/1991 | Sugiura et al. | 324/166 |

FOREIGN PATENT DOCUMENTS 0444875  9/1991  European Pat. Off. ........ 324/121 R

Primary Examiner—Vinh Nguyen
Attorney, Agent, or Firm—Bernard Franzblau

[57] ABSTRACT

It is known to provide measuring instruments, such as oscilloscopes or other measuring instruments, with analog adjustment elements for adjusting various parameters, such as the horizontal and vertical position of a signal (s1, s2) to be displayed, of trigger devices, etc. A digital measuring instrument is disclosed having digital adjustment elements in which the reaction behaviour of the parameters to be set substantially corresponds to that of a measuring instrument with analog adjustment elements. For this purpose, the adjustment elements are constructed as rotatable pulse generators and the measuring instrument is provided with a pulse processing device by which the pulse duration (T, T') of the pulses generators is determined. Thus independently of the rotational speed, a parameter reaction behaviour can be set by this device which results in a natural reaction behavior similar to that of analog adjustment elements.

15 Claims, 3 Drawing Sheets

MEASURING INSTRUMENT WITH DIGITAL PARAMETER CONTROL

BACKGROUND OF THE INVENTION

This invention relates to a measuring instrument for measuring quantities to be displayed, comprising display means for displaying the measured quantities of which at least one parameter is adjustable by adjustment means, which measuring instrument further comprises digital control means.

Such a measuring instrument, for example, an oscilloscope or other instrument, with display means such as a cathode ray tube or a liquid crystal display screen, is capable of measuring and displaying currents, voltages, or other quantities. To provide a flexible display, parameters of the display means can then often be adjusted, such as a horizontal or vertical position of a signal to be displayed, or other parameters.

Such a measuring instrument is known from the journal "Elektronica", no. 18, 1985, pp. 19-29. In the oscilloscope measuring instrument described therein analog potentiometers are used among other items for generating adjustment signals for the adjustment of, for example, horizontal and vertical position, and horizontal and vertical amplification. The measuring instrument comprises digital control means which include two microprocessors. To render possible a disconnection of the operation of the measuring instrument at the front from the operation through an external bus, the potentiometers are disconnected from the processing circuits. For this purpose, the analog voltage at the slider of the potentiometers is periodically compared with a voltage from a digital-to-analog converter, and the adjusted value of the digital-to-analog converter is stored in a data register in the case of equality. The measuring instrument described comprises eleven potentiometers connected to a multiplexer. Compared with known measuring instruments comprising analog potentiometers without operational disconnection and without digital control means, there will be a less natural reaction characteristic of a parameter to be set, such as a horizontal position, of the display means of the measuring instrument to a change of a parameter value set with a potentiometer, because the microprocessor of the measuring instrument which sees to the parameter setting processes the data from the said data register more or less independently of the manner of operation of the potentiometer, so that there is as it were a lack of "feeding", and an unpleasantly slow reaction, for example, may be observed on the display means.

SUMMARY OF THE INVENTION

An object of the invention is, inter alia, to provide a measuring instrument of the kind mentioned in the opening paragraph which has disconnected adjustment means for the parameters, and in which the display means react with "feeling" to change in settings of the adjustment means.

A measuring instrument according to the invention is for this purpose characterized in that the adjustment means comprise at least one rotatable pulse generator for providing pulses, and in that the measuring instrument is provided with a pulse processing device coupled between the pulse generator and the display means, which device ascertains the pulse duration of the pulses and adjusts the parameter on the basis of the ascertained pulse duration. Since the pulse duration of the pulses from the pulse generators is known at all times, and thus the rotational speed of the pulse generators, the measuring instrument is capable of ensuring that a change in the setting is reacted to with "feeling". A parameter to be adjusted will be changed more quickly in proportion as a user of the measuring instrument rotates the pulse generator more quickly, so that a natural reaction characteristic arises.

An embodiment of a measuring instrument according to the invention is characterized in that the pulse processing device comprises a data acquisition circuit which cyclically samples the pulses with a sampling frequency which is relatively high compared with the pulse frequency, and in that the data acquisition circuit determines the pulse duration from the samplings and stores it as a pulse duration data in the case in which the pulse generator rotates during a pulse cycle, or stores a stationary data in the case in which the pulse generator rotates during less than the pulse cycle, and in that the pulse processing device comprises further processing means for adjusting the parameter on the basis of either the pulse duration data or the stationary data. It is achieved in this way that the digital control means have at their disposal rotation speed information about the pulse generators in order to change the parameter setting when the pulse generator rotates and to stop changing the parameter setting when the pulse generator does not rotate any longer.

A further embodiment of a measuring instrument according to the invention is characterized in that the pulse generators each supply two mutually phase-shifted pulses from which the data acquisition circuit determines a rotation direction data, which it stores and passes on to the further processing means. The measuring instrument changes the setting of the parameter also on the basis of the rotation direction data, so that the direction of rotation of the pulse generator is taken into account.

A further embodiment of a measuring instrument according to the invention is characterized in that the further processing means comprise a memory with a table of control data controlled for each pulse generator by the pulse duration data, rotation direction data, and stationary data so as to control a parameter control device for controlling the parameters. The table may be so filled that the speed with which the parameter setting is changed is greater in proportion as the data acquisition circuit ascertains a shorter pulse duration of pulses from a pulse generator. The table may also be filled by the user of the measuring instrument if a different reaction behaviour is desired than that which is pre-programmed by the manufacturer of the measuring instrument. In the latter case, a provision may be made in the measuring instrument in order to store the pre-programmed tables for later use.

A further embodiment of a measuring instrument according to the invention is characterized in that the parameter control device comprises a digital-to-analog converter which cyclically controls a multiplexer circuit per pulse duration data, rotation direction data, and stationary data under the control of the digital control means, outputs of said multiplexer circuit being coupled to hold circuits which supply parameter values. This provides a cyclical refresh of the parameter value settings so that instantaneous changes in the settings or rotational speeds of the pulse generators are continually taken into account. The use of the multiplexer circuit means that there is only a minimum number of digital-to-analog converters, preferably one, necessary. As a result, comparatively expensive components such as digital-to-analog converters are dispensed with and less space is required on a printed circuit, which also reduces costs.

A further embodiment of a measuring instrument according to the invention is characterized in that the parameter values are adapted to the pulse duration data and the rotation direction data in one cycle or in a number of cycles. Depending on the desired reaction behaviour, a certain refresh procedure may be selected from the table. Either the refresh takes place in one cycle, or it is spread over a number of cycles, by which a more fluent refresh characteristic is obtained.

BRIEF DESCRIPTION OF THE DRAWINGS

The invention will be explained in more detail with reference to the accompanying drawing in which.

DESCRIPTION OF THE PREFERRED EMBODIMENTS

Figure 1:
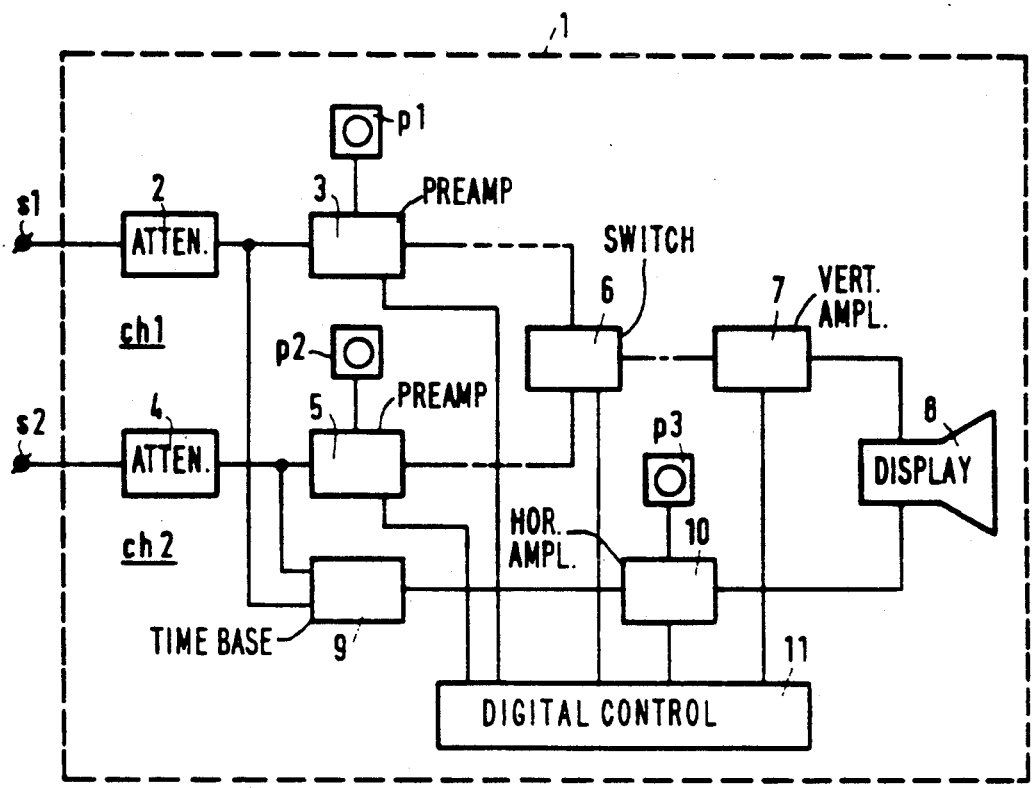
FIG. 1 shows a block diagram of an oscilloscope as a measuring instrument.

FIG. 1 shows a very simplified block diagram of an oscilloscope as a measuring instrument 1 having input means by means of which a first channel ch1 supplies a signal s1 to be measured and a second channel ch2 supplies a signal s2 to be measured to attenuators 2 and 4, respectively. The signals s1 and s2 may be periodic signals. The first channel ch1 comprises an attenuator 2 followed by a preamplifier 3, and the second channel ch2 in similar fashion comprises an attenuator 4 and a preamplifier 5. The channels ch1 and ch2 may be alternately connected to a vertical amplifier 7 via an electronic switch 6 or in chopping mode, an output of the vertical amplifier 7 being connected to display means 8, such as a cathode ray tube. If there is a cathode ray tube, the vertical amplifier 7 controls the vertical deflection of an electron beam. The measuring instrument 1 further comprises a trigger device coupled to the channels ch1 and ch2 with a time base circuit 9 which, if periodic signals are supplied as the signals to be measured, periodically generates a trigger signal for starting the time base circuit. The device 9 is coupled to a horizontal amplifier 10 whose output signal serves to control the horizontal deflection of the electron beam. It is possible with such a measuring instrument 1, inter alia, to display periodic signals visually. The measuring instrument 1 further comprises digital control means 11 which, as is usual, comprise one or several microprocessors and memories for controlling various functions of the measuring instrument 1. The measuring instrument comprises adjustment means for setting at least one parameter, such as display parameters like horizontal and vertical position of the signal to be displayed, and other parameters such as trigger parameters. In a conventional oscilloscope as a measuring instrument, such adjustment means may comprise analog controls such as potentiometers. In a measuring instrument 1 according to the invention, the adjustment means comprise rotatable pulse generators which can each generate two phase-shifted pulses from which adjustment information can be derived. Thus, the vertical position of the displayed signal s1 may be set on the basis of pulses from a pulse generator p1, the vertical position of signal s2 may be set from pulse generator p2, and the horizontal position of the signals s1 and s2 is set from the pulse generator p3. The oscilloscope measuring instrument only serves to illustrate the invention. The oscilloscope may also have a different internal construction. Furthermore, the invention is not limited to oscilloscopes as measuring instruments. The devices 2-7, 9 and 10 provide the means for processing the electric signals at the input means before application thereof to the display means 8.

Figure 2A:
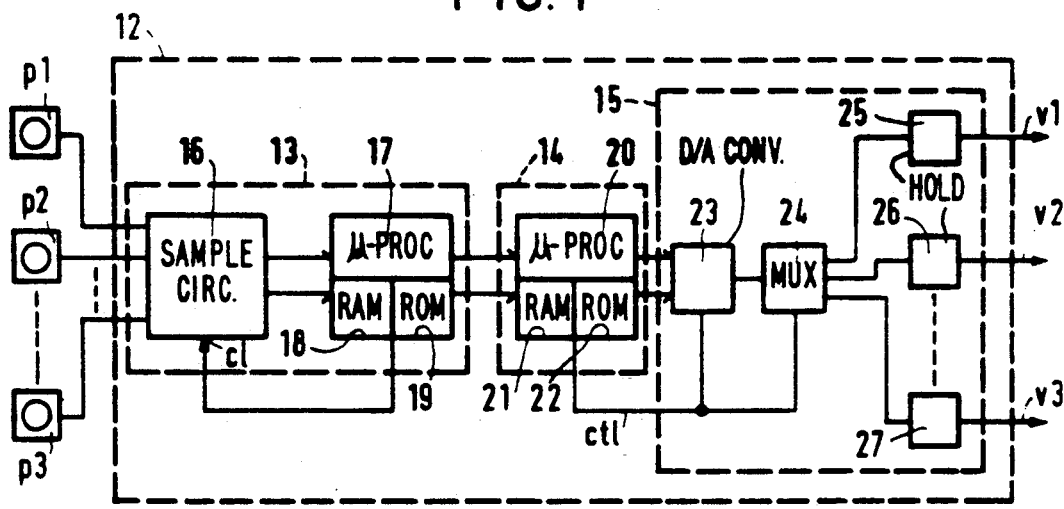
FIG. 2A shows a pulse processing device according to the invention suitable for use in a measuring instrument according to the invention.

FIG. 2A shows a pulse processing device 12 according to the invention which is suitable for use in a measuring instrument 1 according to the invention. The pulse processing device is preferably an interface between the pulse generators, p1, p2, and p3 and the preamplifiers 3, 5 and 10, respectively. Alternatively, the pulse processing device could be incorporated either in the pulse generators or in the preamplifiers. The pulse processing device 12 comprises a data acquisition circuit 13 whose inputs are coupled to the pulse generators p1, p2 and p3. The number of pulse generators is determined by the number of parameters to be set thereby. The pulse processing circuit 12 further comprises processing means 14 whose inputs are coupled to outputs of the data acquisition circuit 13 and whose outputs are coupled to inputs of a parameter control device 15. The parameter control device 15 supplies analog adjustment voltages to further electronic circuits for the adjustment of the parameters.

The data acquisition circuit 13 comprises a sampling circuit 16 by which the pulsatory signals are sampled under the control of a microprocessor 17 which is included in the data acquisition circuit 13 and which comprises a read-write memory 18 (RAM) and a read-only memory 19 (ROM). The microprocessor 17, the RAM 18 and the ROM 19 together provide a means for determining the pulse duration and direction of rotation of the pulse generators. The sampling frequency of a sampling clock signal cl in this case is considerably higher than the pulse frequency of the pulses so as to be able to ascertain the pulse duration of the pulses accurately according to the invention. The read-only memory 19 contains a program to be carried out by the microprocessor 17 and with which it can be ascertained, inter alia, whether the pulse generators give off pulses, i.e. the program determines for each pulse generator whether high-low or low-high transitions take place at sampling moments, and determines from the moments at which such transitions take place the pulse duration of the pulses. When the pulse signal remains high or low during a preset period in a certain scanned pulse channel, the program concludes that the relevant pulse generator is not active and stores for this pulse generator a stationary data in the read-write memory 18, to be further processed by the further processing means 14. Pulse durations found by the microprocessor 17, which represent a rotational speed of the pulse generator, are stored as pulse duration data in the read-write memory after conversion into a number representing the rotational speed. The microprocessor 17 determines for each pulse generator the direction of rotation of the pulse generator from two pulses which are shifted in phase, and stores this information as a rotation direction data in the read-write memory 18.

The further processing means 14, which comprise a microprocessor 20 with a read-write memory 21 and a read-only memory 22, cyclically control the parameter control device 15 in a so-called refresh cycle. The microprocessor 20, whose read-write memory 21 is regularly refreshed with the pulse duration data, rotation direction data, and stationary data stored in the read-write memory 18, controls for each pulse generator a table stored in the read-only memory 22 and/or the read-write memory 21 under the control of a processing program stored in the read-only memory 22. The tables may be filled by the manufacturer of the measuring instrument 1 for each function, or they may alternatively be filled or changed by the user of the measuring instrument 1. Table entries are selected in dependence on the pulse duration data representing the rotational speed of the pulse generator. A certain reaction behaviour of the parameter to be set is desired for each function to be controlled in dependence on the instantaneous rotational speed of the pulse generator. The table may be filled in a corresponding manner. If, for example, a pulse generator is quickly rotated for setting a vertical position of a signal on an oscilloscope, then the parameter control device 15 should provide a greater voltage change per unit time than in the case of a lower rotational speed. According to the invention, a constant refresh cycle is used in the parameter control device 15 for refreshing the analog adjustment voltages, whereby the tables determine the adjustment voltage change. The microprocessor 20 cooperates with the microprocessor 17 on an interrupt basis, i.e. when the microprocessor 17 has determined a pulse duration data or stationary data, it gives an interrupt to the microprocessor 20 which can include the actual situation for the relevant pulse generator(s) in the next refresh cycle or cycles on the basis of this interrupt. Depending on the desired refresh behaviour, a parameter change may be made abruptly or more gradually, i.e. in one refresh cycle or distributed over several refresh cycles.

The parameter control device 15, which is coupled to the further processing means 14, comprises a digital-to-analog converter 23 whose input is coupled to the adjustment voltage tables in the further processing means 14 and whose output is coupled to an analog multiplexer 24. The digital-to-analog converter 23 and the analog multiplexer 24 are so controlled by the microprocessor 20 through control lines ctl that analog adjustment voltages v1, v2 and v3 are cyclically refreshed. To retain the analog voltages v1, v2 and v3 between refresh cycles, hold circuits 25, 26 and 27 are coupled to outputs of the analog multiplexer 24, whose outputs supply the voltages v1, v2 and v3. The hold circuits 25, 26 and 27 may consist of a capacitor followed by an operational amplifier and a buffer. The digital-to-analog converter 23 and multiplexer 24 may be controlled in more detail via an address and data buffer coupled to the microprocessor 20, whose address and data outputs are coupled to a read-write memory connected between the buffer and the digital-to-analog converter 23, while the address outputs are also coupled to the multiplexer 24. A constant refresh convention is safeguarded by this. A refresh cycle may be, for example, 80 μsec, i.e. in the case of 16 voltage adjustments each voltage is refreshed every 5 μsec.

Figure 2B:
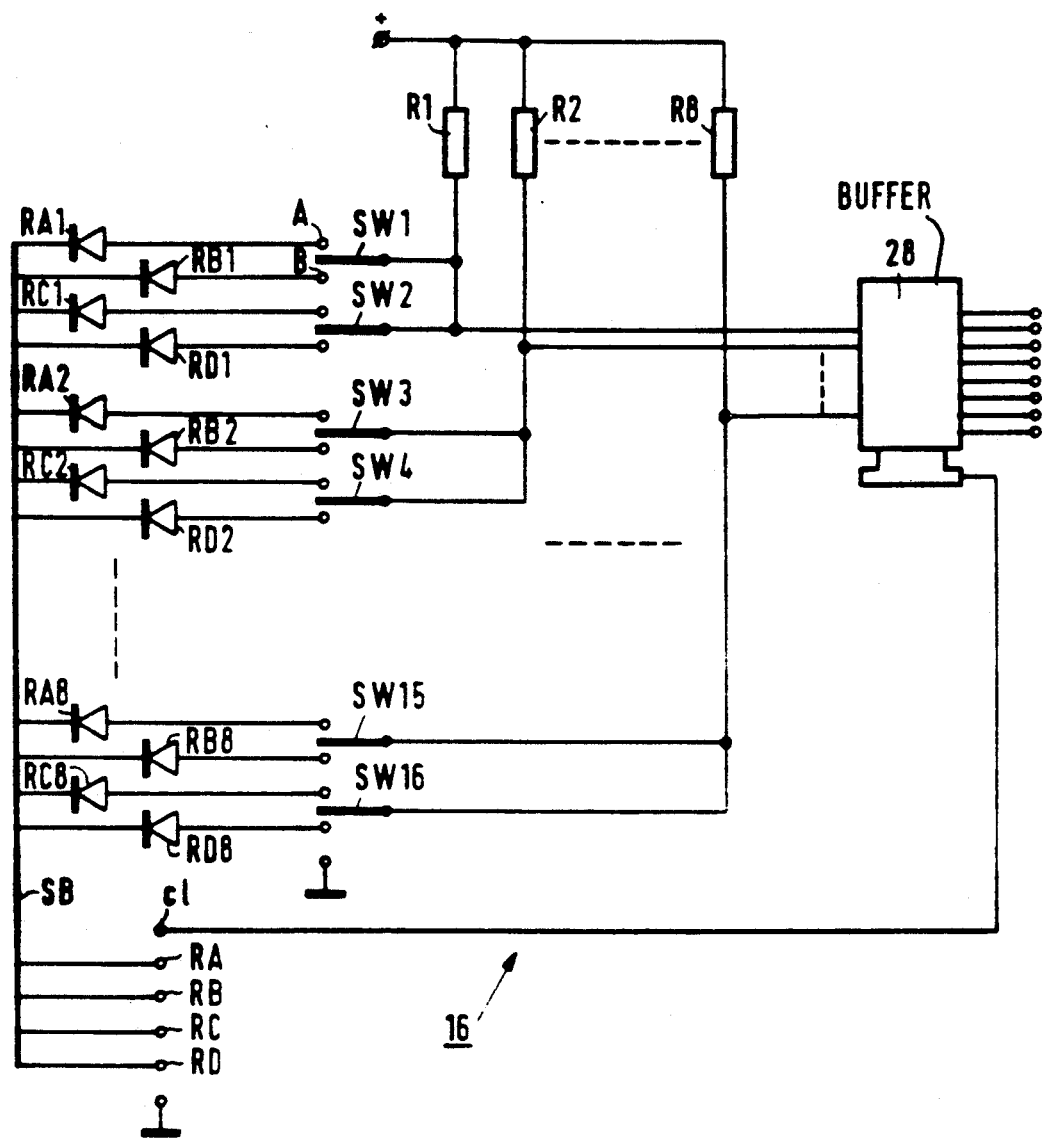
FIG. 2B is a detailed view of a sampling circuit for use in a data acquisition circuit according to the invention.

FIG. 2B shows in detail a sampling circuit 16 for use in a data acquisition circuit 13 according to the invention, and which is coupled at the input side to the pulse generators p1, p2 and p3, and at the output side to the microprocessor 17. The microprocessor 17 supplies the clock signal cl and selection signals RA, RB, RC and RD for selecting groups of pulse generators. The frequency of the clock signal cl is much higher here than the pulse frequency of the pulse generators in order to insure an accurate sampling. The clock signal cl clocks a buffer ("latch") 28 with which a group of samplings of the pulse generators is made in order to be processed by the microprocessor 17, as described. The sampling circuit 16 contains a number of switches SW1, SW2, SW3, SW4 . . . , SW15 and SW16, which represent pulse generator contacts of pulse generators. Outputs A, B of a pulse generator supplying two phase-shifted pulses are coupled to a bus SB of the selection signals RA, RB, RC and RD via diodes RA1, RB1 belonging to SW1. Central contacts of the switches SW1, SW2, SW3, SW4, . . . , SW15 and SW16 are connected to a positive voltage + via resistors R1, R2, . . . , R8, and further to inputs of the buffer 28. In the example given, four groups of eight samplings are transferred to the microprocessor 17 through the buffer 28 under the control of the selection signals RA, RB, RC and RD. If a selection signal is high, a relevant channel will not be sampled. If a selection signal is low and the selection diode is conducting, the relevant channel will be sampled, a low signal being measured if the contact of the pulse generator is closed and a high signal being measured when the contact is open.

Figure 3A:
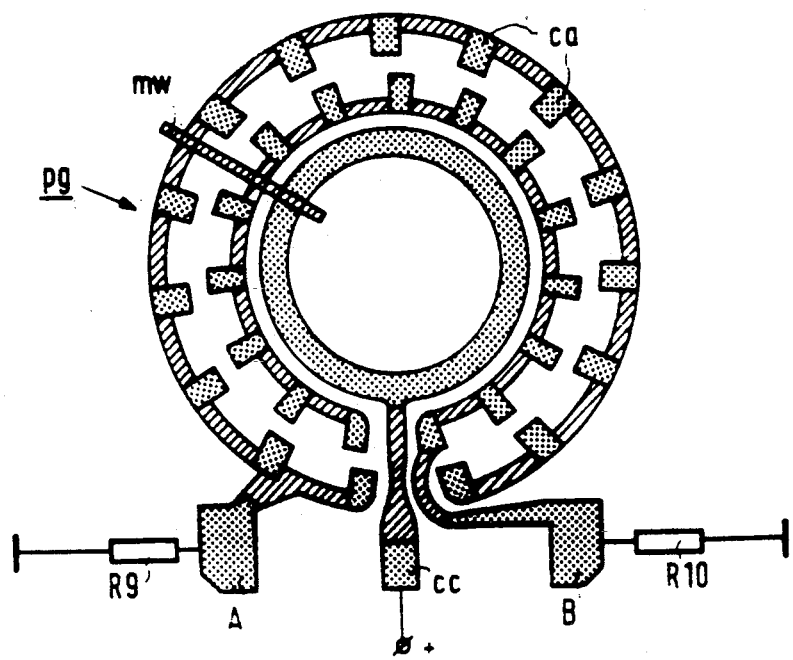
FIG. 3A shows a rotatable pulse generator for use in a measuring instrument according to the invention.

FIG. 3A shows a rotatable pulse generator pg for use in a measuring instrument 1 according to the invention, with outputs A and B for the supply of pulses upon rotation of the pulse generator. The pulse generator pg further comprises contact areas ca and a movable sliding contact mw which is connected to a central contact cc and which makes contact one by one with the contact areas ca upon rotation of the pulse generator. The contact areas ca are so provided (every 24°) that 15 pulses are created per output per rotation, the pulses at the A and B outputs being mutually shifted in phase. The outputs A and B are connected to zero potential through resistors R9 and R10, and the central contact cc to +, as described with reference to FIG. 2B. A practical value for the maximum number of rotations per minute of the pulse generator pg caused by a user of the measuring instrument 1 is 80 rotations per minute, which means 20 pulses per second per output A, B. This maximum rotation speed may be represented as the binary number Hex(FF) for a pulse duration data of, for example, 8 bits. At a sampling frequency 1/Ts of 10 kHz, and at maximum rotation speed of 80 rpm, the measured pulse duration T then is 500 sampling cycles Ts of 100 μsec. By counting the number of sampling periods between a 0→1, a 1→0, and another 0→1 transistion of the pulse, the microprocessor 17 can determine the pulse duration T of the pulses and convert it into a pulse duration data representing the rotation speed of the pulse generator, for example, into the binary 8-bit number Hex(33) for 100 sampling periods. The microprocessor 17 can also determine whether the pulse generator pg is still rotating by detecting whether after a 0→1 transition or after a 1→0 transition there is a 1→0 or 0→1 transition, respectively, after a preset number of sampling periods.

Figure 3B:
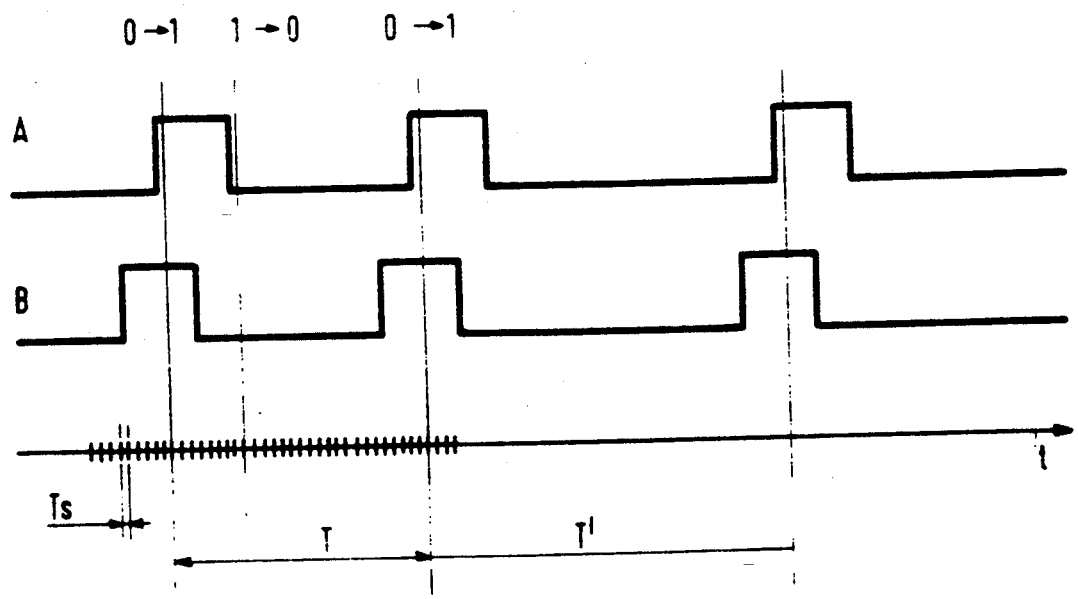
FIG. 3B shows a pulse diagram of such a pulse generator.

FIG. 3B shows a pulse diagram of such a pulse generator pg for pulses at the outputs A and B as a function of time t. The sampling circuit 16 samples the pulses with a sampling frequency 1/Ts which is considerably higher than the pulse frequency 1/T. A variation in the speed of rotation is indicated, which manifests itself in a variable pulse duration T, T'.

I claim:

1. A measuring instrument for measuring quantities to be displayed, comprising: display means for displaying measured signal quantities of which at least one parameter is adjustable by adjustment means, signal processing means for receiving said quantities and for supplying the measured signal quantities to the display means, wherein the adjustment means comprise at least one adjustable rotatable pulse generator for providing pulses, and a pulse processing device coupled between the pulse generator and the display means via the signal processing means which device ascertains a pulse duration of the pulses and adjusts the parameter on the basis of the ascertained pulse duration.

2. A measuring instrument as claimed in claim 1, wherein the pulse processing device comprises a data acquisition circuit which cyclically samples the pulses at a sampling frequency (1/Ts) which is relatively high compared with the pulse frequency (1/T, 1/T'), in that the data acquisition circuit determines the pulse duration (T, T') from the samplings and stores the pulse duration as pulse duration data when the pulse generator rotates during a pulse cycle (T, T'), or stores a stationary data when the pulse generator rotates during less than the pulse cycle and in that the pulse processing device comprises further processing means for adjusting the parameter on the basis of either the pulse duration data or the stationary data.

3. A measuring instrument as claimed in claim 2, wherein said at least one rotatable pulse generator supplies two mutually phase-shifted pulses from which the data acquisition circuit determines rotation direction data, which data the data acquisition circuit stores and passes on to the further processing means.

4. A measuring instrument as claimed in claim 3, wherein the further processing means comprise a memory with a table of control data controlled for each pulse generator by the pulse duration data, rotation direction data, and stationary data so as to control a parameter control device for controlling the parameters.

5. A measuring instrument as claimed in claim 4, wherein the parameter control device comprises a digital-to-analog converter which cyclically controls a multiplexer circuit per pulse duration data, rotation direction data, and stationary data under the control of a digital control means, and means coupling outputs of said multiplexer circuit to hold circuits which supply parameter values.

6. A measuring instrument as claimed in claim 5, characterized wherein the parameter values are adapted to the pulse duration data and the rotation direction data in one cycle or in a number of cycles.

7. A measuring instrument as claimed in claim 1 wherein the measuring instrument comprises an oscilloscope and the parameters are analog adjustment voltages for adjusting, inter alia, horizontal and vertical positions of an electron beam.

8. A pulse processing device suitable for use in a measuring instrument as claimed in claim 1, said device comprising:

a data acquisition circuit which cyclically samples the pulses from the rotatable pulse generator at a sampling frequency that is high relative to the pulse frequency, said data acquisition circuit including means for determining the pulse duration and means for storing same as pulse duration data, and means controlled by said stored pulse duration data for adjusting the at least one parameter.

9. A measuring instrument as claimed in claim 1 further comprising:

digital control means coupled to said signal processing means so as to control the operation thereof.

10. A measuring instrument for measuring quantities to be displayed comprising:

input means for receiving electric signals representing the measured quantities to be displayed, display means for displaying the measured quantities, means coupled between the signal input means and the display means for processing electric signals received at the input means before application thereof to the display means, at least one rotatable pulse generator for providing adjustable pulses by which at least one parameter of the display means can be adjusted, a pulse processing device coupled to an output of the at least one rotatable pulse generator and to the signal processing means and operative to adjust at least one parameter related to the display of said measured quantities and as a function of the pulse duration of the pulses provided by the at least one rotatable pulse generator, and digital control means coupled to said signal processing means to control the operation thereof.

11. A measuring instrument as claimed in claim 10 wherein the pulse processing device comprises:

a data acquisition circuit which cyclically samples the pulses at a sampling frequency which is high relative to the pulse frequency, means for determining from sampled pulses the pulse duration and for storing same as pulse duration data when the pulse generator rotates during a pulse cycle, or stores a stationary data when the pulse generator rotates during less than the pulse cycle, and processing means controlled by the stored pulse duration data or the stationary data for adjusting said at least one parameter as a function thereof.

12. A measuring instrument as claimed in claim 11 wherein said at least one rotatable pulse generator produces two mutually phase shifted trains of pulses, and wherein said determining means includes means for further determining from said phase shifted pulses rotation direction data and further means for storing the rotation direction data for use by said processing means.

13. A measuring instrument as claimed in claim 12 further comprising:

a parameter control device having an input coupled to an output of the processing means and an output for supplying analog parameter control signals, said parameter control device comprising a digital/analog converter which cyclically controls a multiplexer circuit under control of a digital control means in the processing means and as per the stored pulse duration data, the rotation direction data and the stationary data.

14. A measuring instrument as claimed in claim 10 wherein said at least one rotatable pulse generator produces two mutually phase shifted trains of pulses, and wherein the pulse processing device comprises:
  a data acquisition circuit which cyclically samples the pulses at a sampling frequency which is high relative to the pulse frequency,
  means for determining from sampled pulses the pulse duration and the direction of rotation and for storing pulse duration data, stationary data and rotation direction data, and
  processing means controlled by the stored data for adjusting said at least one parameter.

15. A measuring instrument as claimed in claim 14 further comprising:
  a parameter control device having an input coupled to an output of the processing means to receive therefrom digital parameter values, said parameter control device further comprising a digital/analog converter for deriving analog parameter values from received digital parameter values.

* * * * *